(12) United States Patent
Jefferies et al.

(10) Patent No.: US 10,272,792 B2
(45) Date of Patent: Apr. 30, 2019

(54) EVSE INADEQUATE UPSTREAM WIRING PROTECTION METHOD

(71) Applicant: Schneider Electric USA, Inc., Andover, MS (US)

(72) Inventors: Kevin M Jefferies, Raleigh, NC (US); Benjamin W Edwards, Rolesville, NC (US); Matthew L White, Cary, NC (US); Konstantin Alexander Filippenko, Grenoble (FR); Richard Karl Weiler, Wake Forest, NC (US)

(73) Assignee: Schneider Electric USA, Inc., Andover, MA (US)

( * ) Notice: Subject to any disclaimer, the term of this patent is extended or adjusted under 35 U.S.C. 154(b) by 42 days.

(21) Appl. No.: 15/337,021

(22) Filed: Oct. 28, 2016

(65) Prior Publication Data

US 2018/0118046 A1    May 3, 2018

(51) Int. Cl.
| | |
|---|---|
| H02J 7/00 | (2006.01) |
| B60L 11/18 | (2006.01) |
| G01R 31/00 | (2006.01) |
| G01R 31/36 | (2006.01) |
| H02J 7/04 | (2006.01) |

(52) U.S. Cl.
CPC ....... *B60L 11/1838* (2013.01); *B60L 11/1861* (2013.01); *G01R 31/007* (2013.01); *G01R 31/3624* (2013.01); *G01R 31/3648* (2013.01); *H02J 7/0031* (2013.01); *H02J 7/045* (2013.01); *B60L 2230/16* (2013.01); *Y02T 10/7005* (2013.01); *Y02T 10/705* (2013.01); *Y02T 10/7044* (2013.01); *Y02T 10/7088* (2013.01); *Y02T 90/121* (2013.01); *Y02T 90/128* (2013.01); *Y02T 90/14* (2013.01); *Y02T 90/163* (2013.01)

(58) Field of Classification Search
CPC ............. B60L 11/1838; B60L 11/1861; G01R 31/007; G01R 31/3624; G01R 31/3648; H02J 7/0031; H02J 7/007
USPC .................................................. 320/109, 162
See application file for complete search history.

(56) References Cited

U.S. PATENT DOCUMENTS

| | | | |
|---|---|---|---|
| 6,477,021 B1 | 11/2002 | Haun et al. | |
| 7,605,594 B2 | 10/2009 | Blades | |
| 7,636,650 B2 | 12/2009 | Khalil | |
| 7,924,156 B2 | 4/2011 | Colby | |
| 9,093,724 B2 * | 7/2015 | Fujitake | ............. B60L 11/1816 |

(Continued)

OTHER PUBLICATIONS

Hattacharya, S.K., et al., "Control of Machines", Revised Second Edition, cover page, front-matter page and pp. 231-236, 2007.

*Primary Examiner* — M Baye Diao
(74) *Attorney, Agent, or Firm* — Locke Lord LLP

(57) ABSTRACT

An EVSE is equipped with voltage and current monitors to monitor V and I values over the time of charging. Normal V & I charging values for EV charging have been previously established and plotted as a threshold curve. During present charging, the V and Z values are plotted and compared to the threshold values and the slope of the V/I curve. If present value of V is less than the threshold value, or drops over time, or the Z value increases over time; current (I) to the EV is reduced and a new V/I curve is plotted. Slope of the new V/I curve is compared to the threshold and also checked for change of slope over time. If the new V/I curve slope is greater than the threshold slope, or is changing over time, corrective action is taken.

8 Claims, 3 Drawing Sheets

(56) References Cited

U.S. PATENT DOCUMENTS

| | | | |
|---|---|---|---|
| 9,318,944 B2* | 4/2016 | Royak | H02M 7/797 |
| 2003/0065840 A1 | 4/2003 | Kress et al. | |
| 2007/0247768 A1 | 10/2007 | Meehleder et al. | |
| 2013/0204551 A1* | 8/2013 | Outram | H02H 3/006 |
| | | | 702/58 |
| 2013/0300429 A1* | 11/2013 | Jefferies | B60L 3/0069 |
| | | | 324/511 |

* cited by examiner

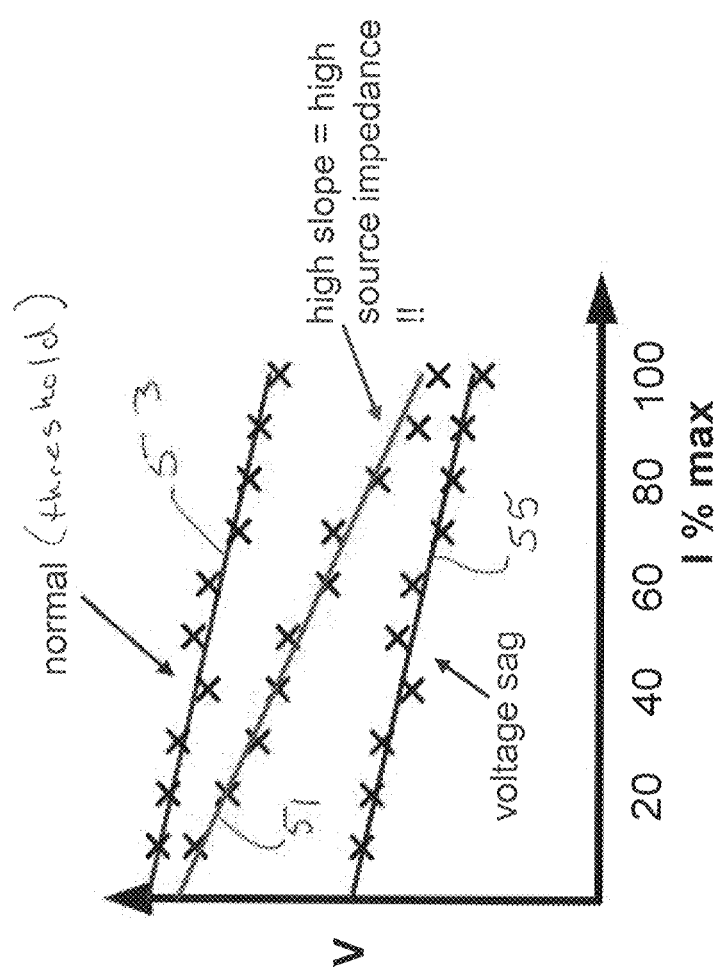

EVSE INADEQUATE UPSTREAM WIRING PROTECTION METHOD

BACKGROUND OF THE INVENTION

1. Field of the Invention

The present invention relates to Electric Vehicle Supply Equipment (EVSE) charging of Electric Vehicles (EVs). More particularly the present invention relates to detecting abnormalities in the charging infrastructure [and distinguishing them from changes in the level of power supplied to the EVSE] and taking steps to prevent damage to equipment or harm to people from the abnormalities.

2. Discussion of the Related Art

With the growth of Electric Vehicle (EV) popularity, charging infrastructure, up to and including the EVSE, must be maintained to safely charge the vehicles. Safety issues may arise from inadequate wiring or poor electrical connections, or both, (herein collectively referred to as "inadequate wiring") within the infrastructure.

It would be desirable to include such inadequate wiring detection with any EVSE installation in a simple and cost effective manner.

SUMMARY OF THE INVENTION

The invention allows an efficient solution to the above-discussed needs by creating a system and method to monitor and compare present charging data point curves of Voltage (V) and Current (I), and calculating the upstream system impedance (Z) over time from these V and I data points. The word "upstream" is used to indicate all points of the infrastructure above the cable going to the EV. This present charging information is then compared to normal "threshold" values established for that equipment during normal charging operations and stored in the EVSE. If abnormality is indicated by this comparison, the current supplied to the EV is lowered and new V & I data points are taken and a new impedance curve is plotted. The slope of the new impedance curve is compared to that of the threshold curve to differentiate between system impedance deviations, possibly caused by wiring abnormalities, when corrective action should be taken, and events such as an electrical system brown out, when there is no wiring abnormality in the system against which to take corrective action.

To this end, aspects of the present invention provide method and apparatus including A method of protecting an EV charging operation against inadequate wiring, comprising:

a. establishing threshold values for V during normal operating of EV charging over time, and plotting a normal in situ operational V & I curve as a "threshold" curve, and storing the threshold V values and threshold curve in the EVSE;

b. sensing and recording present V and I values in the EVSE during charging;

c. periodically creating and storing a present V/I slope plot;

d. periodically calculating the present upstream Z from the present V and I values and storing the calculated Z data, e. periodically comparing the presently sensed V value to the V threshold value and the V recorded values, and comparing the present Z data to stored Z data: and i. if present V value is less than V threshold value, or ii. if V value is dropping over time, or iii. if Z is increasing over time; then:

f. establishing a new V/I slope plot by iteratively reducing current to the EV and measuring V & I, and plotting a new V/I slope for the iteratively reduced currents as a percentage of I max (maximum current offering from the EVSE);

g. comparing the new V/I slope to the threshold slope and if i. the new (V/I) slope is greater than (>) threshold slope or ii. the new V/I slope is changing from that of the stored present V/I slope plot, then h. declaring an upstream wiring fault and taking corrective action to change the EV charging operation in anticipation of the upstream wiring fault.

In other aspects of the present invention, an EVSE is equipped with voltage and current monitors to sample and record V and I values over the time of charging. Normal V & I charging values for EV charging have been previously established and plotted as a threshold curve and stored electronically in the EVSE for comparison to the present data points. During present charging, the V and Z values (Z=V/I) are plotted and compared to the threshold values and the slope of the Z (V/I) curve. If the present value of V is less than the threshold value, or drops over time, or the Z value increases over time; current (I) to the EV is reduced and a new V/I curve (between at least two I % max values) is plotted. Slope of the new V/I curve is compared to the threshold slope and checked for change of slope over time. If the new V/I curve slope is greater than the threshold slope, or is changing over time, corrective action is taken. Corrective action may include one or more of issuing a warning to the user, reducing the charge rate offered to the EV, or disconnecting the EV from the power source (i.e. discontinuing the supply of power to the vehicle).

Apparatus may include:

An EVSE for protecting an EV charging operation against inadequate wiring, comprising:

Voltage sensors for the measurement of voltage values during charging,

Current sensors for the measurement of current draw values during charging; and

Control electronics for the calculation and storage of upstream impedance (Z) values and the comparison of measured voltage values and calculated Z values to preset voltage and impedance value thresholds, respectively, and the triggering of corrective actions in cases where an inadequate wiring condition is determined by one or more of the comparisons.

In order to take further appropriate corrective actions, these problems can be distinguished from the deliberate lowering of the electrical grid's power supply level (i.e. brown out). In EVSE charging the Electric Vehicle adjusts its battery management system in response to the Control Pilot Signal shared with the EVSE. When a brown out is detected by differentiating a low voltage condition from an upstream wiring fault, the EV may be offered a lower charge in order to preserve available energy.

BRIEF DESCRIPTION OF THE DRAWINGS

The foregoing and other advantages of the disclosed embodiments will become apparent upon reading the following detailed description and upon reference to the drawings, wherein:

FIG. 3 illustrates comparisons of the Impedance curves which may occur and might be used with the present invention.

DETAILED DESCRIPTION

As an initial matter, it will be appreciated that the development of an actual commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

Figure 1:
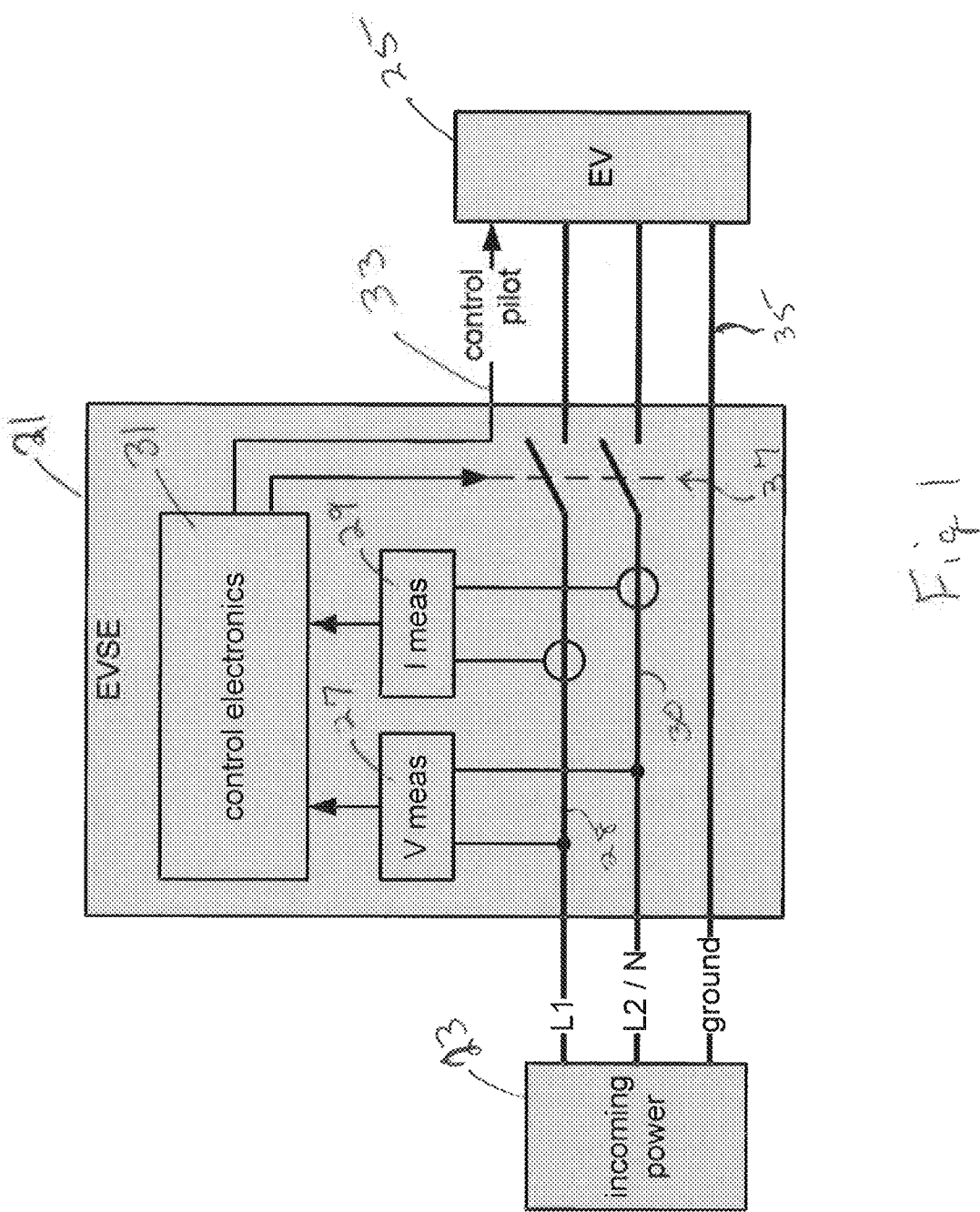
FIG. 1 is a functional diagram of charging power delivery systems and an attached EV according to aspects of the present invention.

Referencing the functional diagram of FIG. 1, an EVSE 21 receives line power 23 from the grid or other source for the charging of an attached EV 25. The EVSE is equipped with voltage sensors 27 and current sensors 29 for appropriate sensing of the power line conductors 28, 30 and reporting their data to the control electronics 31 in the EVSE 21 necessary to performing the storage and calculations and various control functions of the present invention. The selection of particular electronic components and sensors is left to the designer and believed to be within the ordinary skill in the art of EVSE design. The control pilot line 33 and ground line 35 necessary for charging of the EV are also illustrated. A contactor 37 within the EVSE 21 controls the flow of power to the EV 25 by opening or closing L1 and L2/N power line conductors 28, 30, respectively.

Figure 2:
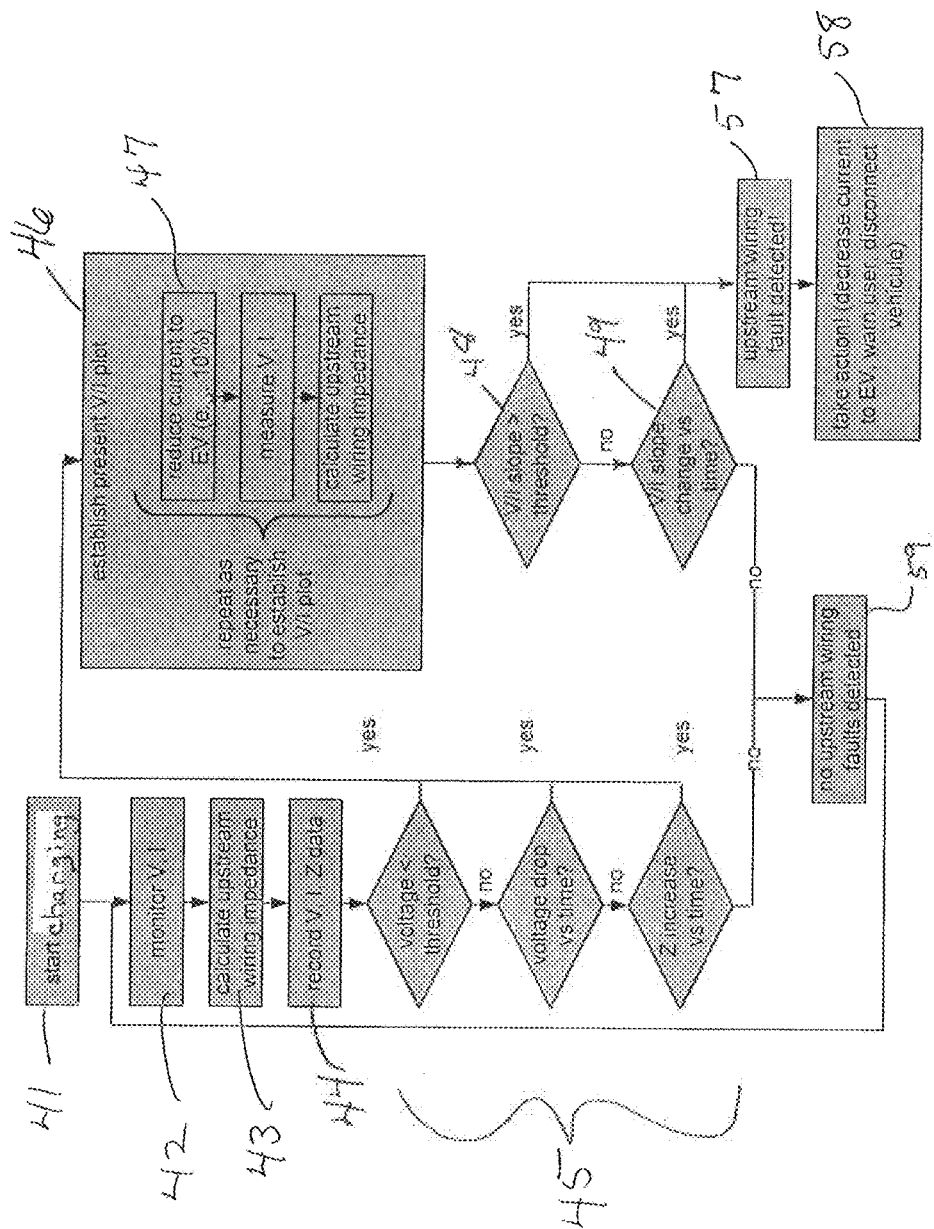
FIG. 2 is a flow chart for determining corrective action according to aspects of the present invention.

The flow chart of FIG. 2 shows the sequence of operations used to determine that conditions exist which warrant action. At the first step 41 charging is started by closing the contactor 37 (FIG. 1). At the second step 42 the present current (I) and voltage (V) values are monitored and stored, and at the third step 43 the values are used to calculate an upstream impedance (Z). These values (Z and V at I % max) are recorded at a fourth step 44 and compared to established threshold values at a fifth step 45 to determine if a new slope of the V/I relationship over time should then be calculated at a sixth step 46. The threshold values might be preloaded as an ideal curve by the EVSE maker from the factory, or established during a commissioning process during in situ operations of the EVSE.

Referencing also FIG. 3, if the data point thresholds are exceeded, the EVSE can control, at step 47, the current flowing to the vehicle, and use this action to plot a NEW V/I curve 51 (see FIG. 3). The slope of the New V/I curve can be compared to the slope of the threshold curve 53, at step 48, or against previously measured slope at step 49 to detect changes. The 'normal' slope plot (a.k.a. "threshold curve") can be preloaded from the factory, or initialized during commissioning. The device can differentiate between a voltage sag curve 55 and an impedance change upstream of the load by comparing the slope plots 51, 55 to the normal slope threshold curve 53. If thresholds for slope value or change in slope value are determined to be exceeded, as at the YES points of steps 48 and 49, an upstream wiring fault is considered detected as at decision point 57, and the EVSE device will take the preprogramed response action as at response point 58. A voltage sag is detected by occurrence of a curve 55 of reduced voltage measurement but a slope not above the normal slope threshold. A voltage sag does not indicate upstream wiring faults, as at decision point 59, but detection of a voltage sag may trigger actions such as decreasing charge rate to ease present strain on the grid. As shown in the flowchart (step 49), the device can also compare the current V/I slope measurement to previously measured V/I slope values, to detect an unexpected change and allow taking action to determine the cause of the upstream impedance change.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the invention as defined in the appended claims.

The invention claimed is:

1. A method of protecting an electric vehicle supply equipment (EVSE) charging operation of an electric vehicle (EV) against inadequate wiring, comprising:
   a. establishing threshold values for voltage (V) on a power line conductor during a normal EVSE charging operation over time, and plotting a threshold voltage over current (V/I) curve for voltage and current on the power line conductor during the normal EVSE charging operation, and storing the threshold values for V and the threshold V/I curve in the EVSE;
   b. sensing, by a voltage sensor and a current sensor, respectively, present V and I values on the power line conductor during charging of the EV and recording, by control electronics of the EVSE, the present V and I values;
   c. periodically creating, by the control electronics, a present V/I slope plot and storing the present V/I slope plot;
   d. periodically calculating, by the control electronics, present upstream impedance (Z) data from the present V and I values and storing the present upstream Z data;
   e. periodically comparing, by the control electronics, a presently sensed V value on the power line conductor to the threshold values for V and the recorded present V values, and comparing present Z data to the stored present upstream Z data: and
      i. if the presently sensed V value is less than the threshold values for V, or
      ii. if V value is dropping over time, or
      iii. if Z is increasing over time; then:
   f. establishing, by the control electronics, a new V/I slope plot by iteratively reducing current to the EV and measuring voltage and current on the power line conductor, and plotting a new V/I slope;

g. comparing, by the control electronics, the new V/I slope to a slope of the threshold V/I curve and if
  i. the new V/I slope>the slope of the threshold V/I curve or
  ii. the new V/I slope is changing from that of the stored present V/I slope plot, then
h. declaring, by the control electronics, an upstream wiring fault and taking corrective action to change the charging operation of the EV in anticipation of the upstream wiring fault.

2. The method of protecting an EVSE charging operation of an EV against inadequate wiring according to claim 1 wherein
comparing the new V/I slope to the slope of the threshold V/I curve further comprises, if
  i. the new V/I slope is not >the slope of the threshold V/I curve and
  ii. the new V/I slope is not changing from that of the stored present V/I slope plot, and if a voltage level is below the threshold values for V, then
declaring a brown out situation and taking corrective action to change the charging operation of the EV in anticipation of a lowered power delivery.

3. The method of protecting an EVSE charging operation of an EV against inadequate wiring, according to claim 1 wherein the corrective action is at least one of issuing a warning to a user, reducing a charge rate offered to the EV, or disconnecting the EV from a power source.

4. An electric vehicle supply equipment (EVSE) for protecting against inadequate wiring, comprising:
  a voltage sensor for measurement of voltage values during charging of an electric vehicle (EV),
  a current sensor for measurement of current draw values during the charging of the EV; and
  control electronics for:
    calculation and storage of upstream impedance (Z) values based on voltage and current draw values measured during the charging of the EV,
    comparison of measured voltage values and calculated Z values to preset voltage and impedance value thresholds, respectively, and
    triggering of corrective actions in cases where an inadequate wiring condition is determined by one or more of the comparisons.

5. An electric vehicle supply equipment (EVSE) for protecting against inadequate wiring, the EVSE storing established threshold values for voltage (V) on a power line conductor during a normal EVSE charging operation of an electric vehicle (EV) over time, and a threshold voltage over current (V/I) curve for voltage and current on the power line conductor during the normal EVSE charging operation, the EVSE comprising:
  a voltage sensor configured to sense present V values on the power line conductor during charging of an EV;
  a current sensor configured to sense present I values on the power line conductor during charging of the EV; and
  control electronics configured to:
    record the present V and I values;
    periodically create a present V/I slope plot and store the present V/I slope plot;
    periodically calculate present upstream impedance (Z) data from the present V and I values and store the present upstream Z data;
    periodically compare a presently sensed V value on the power line conductor to the threshold values for V and the recorded present V values, and compare present Z data to the stored present upstream Z data: and
      if the presently sensed V value is less than the threshold values for V, or
      if V value is dropping over time, or
      if Z is increasing over time; then:
    establish a new V/I slope plot by iteratively reducing current to the EV and measuring voltage and current on the power line conductor, and plotting a new V/I slope;
    compare the new V/I slope to a slope of the threshold V/I curve and if
      the new V/I slope >the slope of the threshold V/I curve or
      the new V/I slope is changing from that of the stored present V/I slope plot, then
    declare an upstream wiring fault and take corrective action to change the charging operation of the EV in anticipation of the upstream wiring fault.

6. The EVSE for protecting against inadequate wiring according to claim 5, wherein the control electronics is further configured to establish the threshold values for V and the threshold V/I curve.

7. The EVSE for protecting against inadequate wiring according to claim 5, wherein the control electronics is further configured to, upon comparing the new V/I slope to the slope of the threshold V/I curve, if
  the new V/I slope is not >the slope of the threshold V/I curve and
  the new V/I slope is not changing from that of the stored present V/I slope plot,
  and if a voltage level is below the threshold values for V, then
declare a brown out situation and taking corrective action to change the charging operation of the EV in anticipation of a lowered power delivery.

8. The EVSE for protecting against inadequate wiring according to claim 5, wherein the corrective action is at least one of issuing a warning to a user, reducing a charge rate offered to the EV, or disconnecting the EV from a power source.

* * * * *